United States Patent
Spring

(10) Patent No.: US 6,818,958 B2
(45) Date of Patent: Nov. 16, 2004

(54) SEMICONDUCTOR DEVICE AND PROCESS FOR ITS MANUFACTURE TO INCREASE THRESHOLD VOLTAGE STABILITY

(75) Inventor: Kyle Spring, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/120,287

(22) Filed: Apr. 10, 2002

(65) Prior Publication Data

US 2002/0149079 A1 Oct. 17, 2002

Related U.S. Application Data

(60) Provisional application No. 60/283,803, filed on Apr. 13, 2001.

(51) Int. Cl.[7] .......................... H01L 29/76; H01L 29/94; H01L 31/062; H01L 31/113; H01L 31/119

(52) U.S. Cl. ...................... 257/395; 257/401; 257/409; 257/494

(58) Field of Search ................................ 257/774, 395, 257/401, 409, 494

(56) References Cited

U.S. PATENT DOCUMENTS

| | | | | |
|---|---|---|---|---|
| 4,199,778 A | * | 4/1980 | Masuhara et al. | 257/758 |
| 4,929,992 A | * | 5/1990 | Thomas et al. | 257/382 |
| 5,001,538 A | * | 3/1991 | Pollock et al. | 257/552 |
| 5,252,504 A | * | 10/1993 | Lowrey et al. | 438/210 |
| 5,274,263 A | * | 12/1993 | Wadsworth | 257/409 |
| 5,557,127 A | * | 9/1996 | Ajit et al. | 257/339 |
| 5,587,338 A | * | 12/1996 | Tseng | 438/672 |
| 5,831,318 A | * | 11/1998 | Spring et al. | 257/402 |
| 5,998,263 A | * | 12/1999 | Sekariapuram et al. | 438/259 |
| 6,022,790 A | * | 2/2000 | Wagers et al. | 438/454 |
| 6,051,472 A | * | 4/2000 | Abiko et al. | 438/296 |
| 6,080,608 A | * | 6/2000 | Nowak | 438/151 |
| 6,100,572 A | * | 8/2000 | Kinzer | 257/492 |
| 6,548,871 B1 | * | 4/2003 | Horita et al. | 257/368 |

* cited by examiner

*Primary Examiner*—Maria F. Guerrero
*Assistant Examiner*—Ida M. Soward
(74) *Attorney, Agent, or Firm*—Ostrolenk, Faber, Gerb & Soffen, LLP

(57) ABSTRACT

The oxide atop a P pad below the gate electrode has a cut completely through the oxide atop the P pad to prevent the drift of contamination ions, such as sodium ions from the periphery of a MOSgated device to the periphery of the active area, thus stabilizing the device threshold voltage under high temperature reverse bias. The cut may be filled with metal.

12 Claims, 2 Drawing Sheets

SEMICONDUCTOR DEVICE AND PROCESS FOR ITS MANUFACTURE TO INCREASE THRESHOLD VOLTAGE STABILITY

RELATED APPLICATION

This application claims the benefit of U.S. Provisional Application No. 60/283,803, filed Apr. 13, 2001.

FIELD OF THE INVENTION

This invention relates to semiconductor devices and more specifically relates to a structure and process to improve the threshold voltage stability of a MOSgated device under high temperature reverse bias.

BACKGROUND OF THE INVENTION

The threshold voltage ($V_{th}$) of MOSgated devices has been found to shift under high temperature reverse bias (HTRB).

More specifically, a $V_{th}$ shift of about (−) 1 volt has been found after about 500 to 1000 hours HTRB.

It is believed that this is caused by sodium ions in the field oxide which drift laterally and accumulate at the edge of the channel in the first active cell or stripe.

BRIEF DESCRIPTION OF THE INVENTION

In accordance with the present invention, a cut is made in the $P^+$ oxide layer to eliminate an $Na^+$ diffusion path. This cut has been found to substantially stabilize $V_{th}$ in HTRB up to 1000 hours.

DETAILED DESCRIPTION OF THE DRAWINGS

Figure 1:
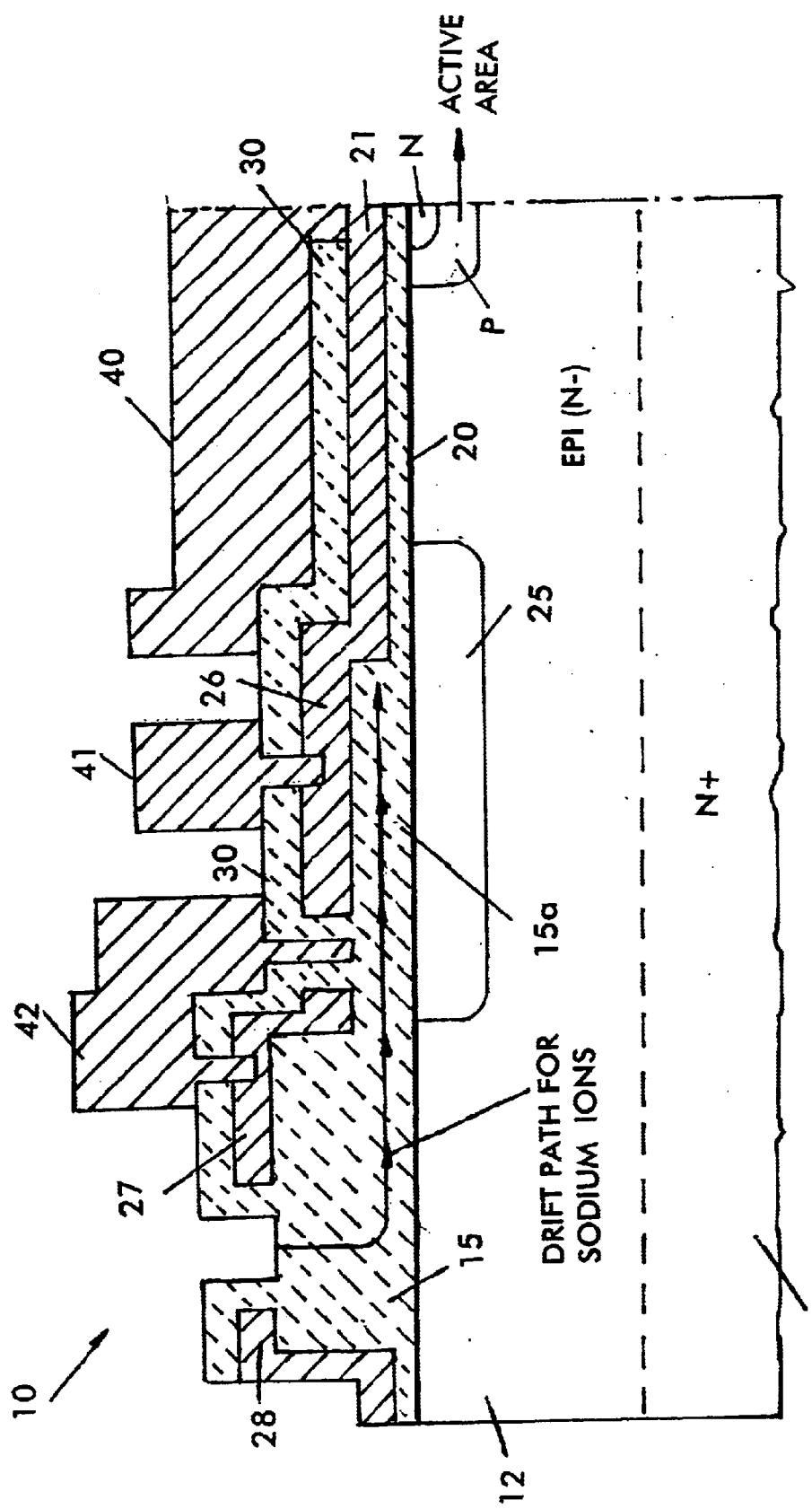
FIG. 1 is a cross-section of a small section of a prior art device, showing the drift path for a sodium ions.

FIG. 1 shows a portion of a MOSgated device die in which an $N^-$ epi junction-receiving layer has a $P^+$ field oxide which receives field plates as shown. The active area has a polysilicon gate atop the gate oxide. A gate metal contact is connected to the gate poly and a front metal (source electrode) is atop an insulation layer over the gate poly.

More specifically, FIG. 1 shows a small portion of the termination region of a MOSgated device die 10, such as a MOSFET, IGBT or the like in which the die is one of a plurality of die simultaneously processed in wafer form in a wafer having an $N^+$ substrate 11 of any desired thickness and having a junction-receiving $N^-$ epitaxially grown layer 12. Layer 12 has any desired thickness and resistivity, depending on the desired reverse voltage capability of the device.

In the manufacture of the device, a thick field oxide 15 is first formed as by growth or deposition of silicon dioxide. A guard ring mask is used to form the $P^+$ region 25. A $P^+$ oxide 15a is grown during the drive of the $P^+$ diffusion. The central area of each of die 10 is then opened in a conventional mask step to define a central active area which receives the necessary well known channel and source diffusions defining the MOSgated structure (only a portion of the first active cell is shown). During this process, a thin gate oxide 20 is grown on the surface of the epitaxial layer, and a conductive polysilicon layer 21 is deposited atop gate oxide 20.

During this processing, the polysilicon layer 21 (which is used as the MOSgated device gate in the active area) is stepped up over the inner edge of the $P^+$ region 25. The polysilicon layer 21 is further divided into two concentric rings 27 and 28, acting as a field plate and an EQR ring respectively. The polysilicon layers 21, 26, 27 and 28 are conventionally covered by a further insulation layer 30 such as TEOS. Further insulation layer 30 may also include an oxide $P^+$ layer.

A front metal which may be aluminum is next deposited on the top surface of the wafer and, in a metal mask step, is patterned and etched to define a source metal 40 (the source contact for a MOSFET), a gate bus 41 connected to polysilicon layer 21 (and which may be a stripe or a ring) and a field plate contact 42, which may form a terminal ring.

In the structure shown in FIG. 1, it is possible for sodium ions $Na^+$ to enter through the field oxide and drift to the right through the oxide atop the $P^+$ region 25, and to the active region. These positively charged ions will then affect the device threshold voltage.

Figure 2:
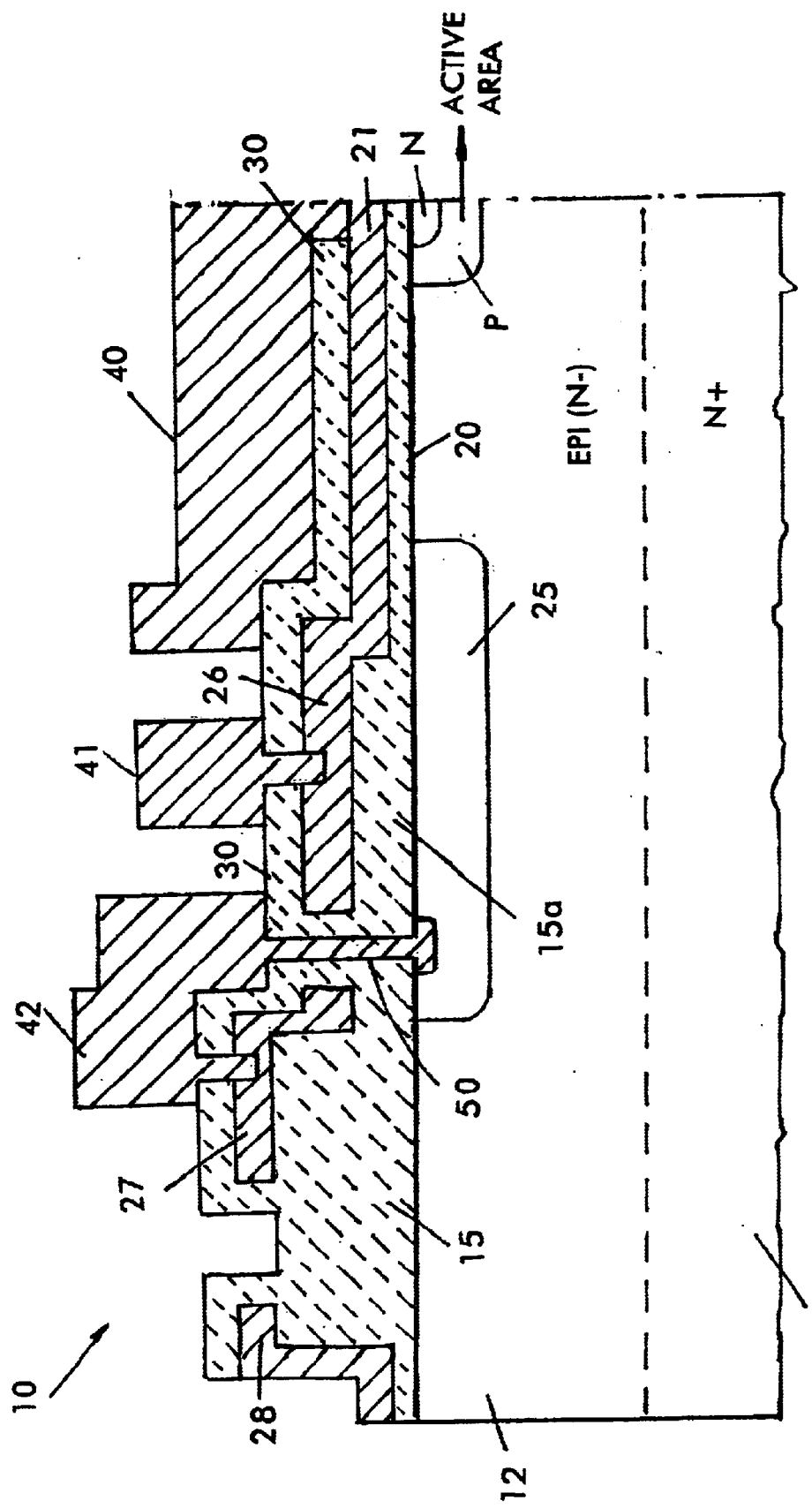
FIG. 2 shows the provision of a cut through the $P^+$ field oxide which prevents or blocks the drift of sodium ions toward the active region.

In accordance with the invention, and as shown in FIG. 2, a slot or cut 50 is made in the oxide $P^+$ layers 15a, 30 and from the $P^+$ region 25 to the field plate contact 42. Slot 50 may be filled with aluminum when the layers 40, 41, 42 are deposited. Slot 50 then blocks the diffusion path for sodium ions and has been found to stabilize $V_{th}$ under reverse bias.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. In a MOSgated device comprising a semiconductor die having a central active region, an oxide region and a peripheral termination region; said device having an insulation layer atop said peripheral termination region; a termination diffusion in the surface of said semiconductor die in said termination region; a gate metal contact disposed above said termination diffusion and atop said insulation layer and connected to the MOSgated device gate; and an isolation slot extending from the top of said oxide region to the interior of said diffusion, said slot being disposed between the edge of said die and the periphery of said active region, the isolation slot dividing the oxide region into first and second oxide region portions, the first and second oxide region portions not contacting one another, wherein the drift of impurity ions through said insulation layer from the peripheral termination region to the periphery of the active region is prevented.

2. The device of claim 1, wherein said ions are principally mobile ions such as sodium impurities.

3. The device of claim 1, wherein said slot is filled with metal which is connected to a peripheral field ring metal.

4. The device of claim 2, wherein said slot is filled with metal which is connected to a peripheral field ring metal.

5. A MOSgated device having a stable threshold voltage; said device comprising a silicon die having a central active area and a peripheral termination area surrounding said central active area; said termination area and active area having a continuous oxide coating connecting the two areas; and an isolation slot through the full thickness of said oxide, the isolation slot dividing the oxide coating into first and second oxide regions, the first and second oxide regions not contacting one another, wherein the path against the possible movement of contamination ions through said oxide from said termination area to said active area is prevented.

6. The device of claim 5, wherein said slot is filled with metal.

7. The device of claim 5, wherein said contamination ions are mobile ions such as sodium.

8. The device of claim 5, wherein said die has a diffusion in the surface of said peripheral termination area; said slot extending into said diffusion.

9. The device of claim 6, wherein said die has a diffusion in the surface of said peripheral termination area; said slot extending into said diffusion.

10. The device of claim 9, wherein said contamination ions are mobile ions such as sodium.

11. The device of claim 5, wherein said oxide is $P^+$ oxide.

12. The device of claim 8, wherein said oxide is $P^+$ oxide.

* * * * *